US011401158B2

(12) United States Patent
Thomas

(10) Patent No.: US 11,401,158 B2
(45) Date of Patent: Aug. 2, 2022

(54) SENSOR PACKAGES

(71) Applicant: Atlantic Inertial Systems Limited, Plymouth (GB)

(72) Inventor: Henry Thomas, Plymouth (GB)

(73) Assignee: ATLANTIC INERTIAL SYSTEMS, LIMITED, Plymouth (GB)

( * ) Notice: Subject to any disclaimer, the term of this patent is extended or adjusted under 35 U.S.C. 154(b) by 0 days.

(21) Appl. No.: 16/549,003

(22) Filed: Aug. 23, 2019

(65) Prior Publication Data
US 2020/0062585 A1 Feb. 27, 2020

(30) Foreign Application Priority Data
Aug. 24, 2018 (GB) .................................... 1813815

(51) Int. Cl.
*B81B 7/00* (2006.01)
*B81C 1/00* (2006.01)
(52) U.S. Cl.
CPC ........ *B81B 7/0058* (2013.01); *B81C 1/00301* (2013.01); *B81B 2207/07* (2013.01)
(58) Field of Classification Search
CPC ... B81B 7/0058; B81B 2207/07; B81B 7/007; B81C 1/00301; H01L 2224/48091; G01L 19/0645; G01L 19/0069; G01L 19/0084; G01P 1/023; G01C 19/5783
See application file for complete search history.

(56) References Cited

U.S. PATENT DOCUMENTS

| | | | | |
|---|---|---|---|---|
| 5,146,303 A | * | 9/1992 | Kornrumpf | ........... H01L 25/167 257/E25.032 |
| 5,157,255 A | * | 10/1992 | Kornrumpf | ........... H01L 25/167 250/252.1 |
| 5,223,741 A | * | 6/1993 | Bechtel | ................... H01L 25/16 257/E23.109 |
| 9,781,519 B2 | | 10/2017 | Saxena | |

(Continued)

FOREIGN PATENT DOCUMENTS

| | | |
|---|---|---|
| EP | 1407278 B1 | 4/2004 |
| EP | 2573514 B1 | 3/2013 |

OTHER PUBLICATIONS

European Search Report for Application No. 19193483.5, dated Jan. 24, 2020, 8 pages.

(Continued)

*Primary Examiner* — Edward Chin
(74) *Attorney, Agent, or Firm* — Cantor Colburn LLP

(57) ABSTRACT

A sensor package includes a sensor, at least one external wall, and an interposer, arranged between the sensor and the at least one external wall. The sensor is wire bonded to the interposer and the interposer is wire bonded to the at least one external wall. Using an interposer, wire bonded to both the sensor and the at least one external wall, is an improved approach to electrically connecting a sensor and a sensor package. The interposer allows for short wire bonds from the sensor and the at least one external wall to the interposer, replacing the single, long wire bond from the sensor to the at least one external wall in the prior art. This provides improved resilience of the sensor package under high stress. Furthermore, it allows an existing sensor and package combination to be improved without needing to redesign either component.

12 Claims, 3 Drawing Sheets

(56) References Cited

U.S. PATENT DOCUMENTS

| | | | |
|---|---|---|---|
| 9,932,221 B1 | 4/2018 | Natan et al. | |
| 10,685,949 B2* | 6/2020 | Aleksov | H01L 24/78 |
| 2003/0177831 A1 | 9/2003 | Ikezawa et al. | |
| 2006/0130582 A1 | 6/2006 | Kurogi | |
| 2010/0043550 A1 | 2/2010 | Ohta | |
| 2011/0293126 A1* | 12/2011 | Maekawa | H04R 19/005 |
| | | | 381/355 |
| 2014/0072151 A1* | 3/2014 | Ochs | B81B 7/0064 |
| | | | 381/174 |
| 2014/0374847 A1 | 12/2014 | Hrovat | |
| 2017/0047271 A1 | 2/2017 | Zapico | |
| 2018/0290882 A1* | 10/2018 | Rhee | B81C 1/00301 |
| 2019/0241428 A1* | 8/2019 | Mitchell | B81B 7/0048 |

OTHER PUBLICATIONS

Intellectual Property Office Search Report for Great Britain Application No. 1813815.6 dated Nov. 30, 2018, 3 pages.

\* cited by examiner

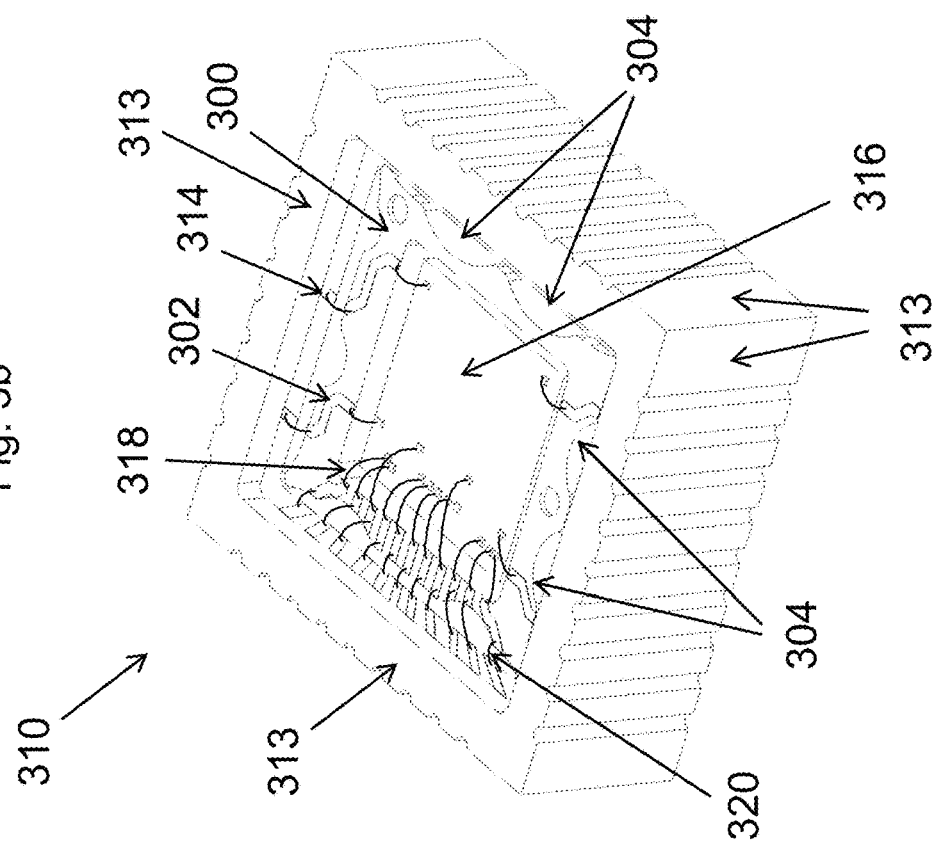
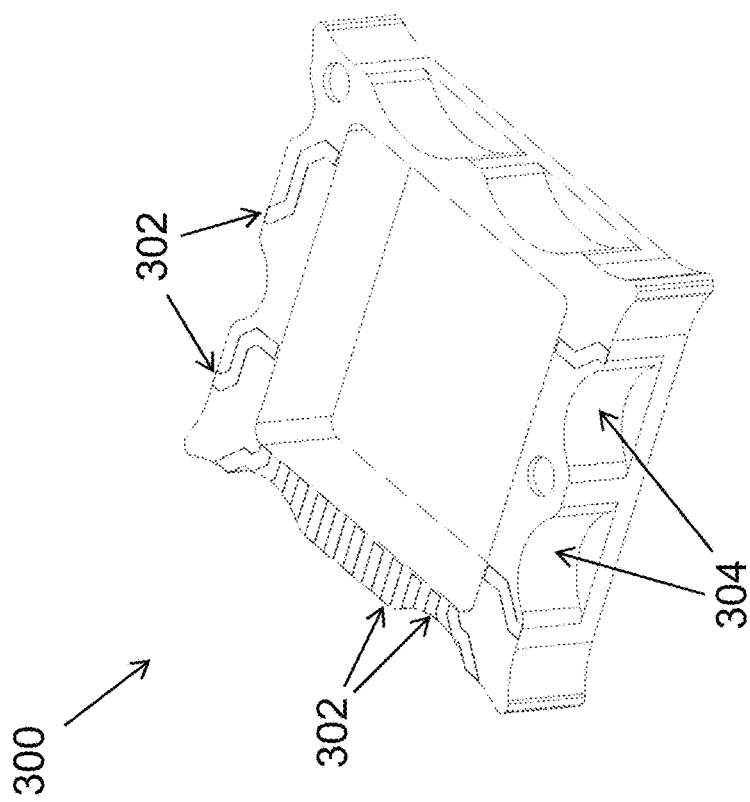

SENSOR PACKAGES

FOREIGN PRIORITY

This application claims the benefit of Great Britain Patent Application No. 1813815.6 filed Aug. 24, 2018, the entire contents of which is incorporated herein by reference.

TECHNICAL FIELD

The present disclosure relates to the packaging of sensors, and maximising sensor package resilience under high stress. There is disclosed a sensor package and methods of making a sensor package.

BACKGROUND

Sensors, for example pressure sensors or inertial sensors (such as accelerometers and gyroscopes) are used in many applications, including inertial navigation, robotics, avionics, and automobiles. In inertial navigation applications, such sensors may be found in self-contained systems known as "inertial measurement units" (IMUs). IMUs typically contain a plurality of accelerometers and/or gyroscopes, and provide an estimate of an object's travel parameters such as angular rate, acceleration, altitude, position, attitude and velocity, based on the outputs of gyroscope(s) and/or accelerometer(s). Each inertial sensor in an IMU is a self-contained package.

Microelectromechanical systems (MEMS)-based sensors can be used e.g. to measure pressure or temperature, or linear or angular motion without a fixed point of reference. MEMS pressure sensors often work on the principle of mechanical deformation of a MEMS structure due to fluid pressure. MEMS gyroscopes, or strictly speaking MEMS angular rate sensors, can measure angular rate by observing the response of a vibrating MEMS structure to Coriolis force. MEMS accelerometers can measure linear acceleration by observing the response of a proof mass suspended on a spring in a MEMS structure. High performance MEMS inertial sensors are defined by their bias and scale factor stability.

Due to the applications of such sensors, they may on occasion be subject to extremely high forces e.g. accelerations on the order of >20,000G. Under such conditions, components within the sensor package may begin to fail. Typically, the first failure within the sensor package occurs due to the wire bonds connecting the package to the sensor. The wire bonds may short circuit one another, or experience a joint break at the place where the wire bond is joined to the pad of the sensor or package. This is obviously undesirable as it decreases the functional range of the sensor, and furthermore requires replacement of the unit in either breakage scenario described above.

The present disclosure seeks to address at least some of these shortcomings.

SUMMARY

According to a first embodiment of this disclosure, there is provided a sensor package that includes a sensor, at least one external wall, and an interposer, arranged between the sensor and the at least one external wall. The sensor is wire bonded to the interposer and the interposer is wire bonded to the at least one external wall.

In one embodiment of the sensor package, the interposer comprises conductive tracking, the sensor is wire bonded to the conductive tracking, and the conductive tracking is wire bonded to the at least one external wall.

In any prior embodiment of the sensor package, the at least one external wall is made from a first material, the interposer is made from a second material, and the first and second materials are different.

In any prior embodiment of the sensor package, the second material is plastic, and optionally wherein the interposer is formed by injection moulding. When formed of plastic, the interposer can be a Moulded Interconnect Device (MID).

In any prior embodiment of the sensor package, the interposer is fitted inside the package in contact with the at least one external wall.

In any prior embodiment of the sensor package, the interposer is adhesively bonded to the at least one external wall. In such an embodiment, the interposer can be shaped to accommodate the adhesive.

In any prior embodiment of the sensor package, at least two of the interposer, the sensor, and the at least one external wall are in the same plane.

In any prior embodiment of the sensor package, the interposer fills at least 50% of the space between the sensor and the at least one external wall.

In any prior embodiment of the sensor package, the sensor package further comprises potting or a lid to seal the package.

According to a second embodiment of this disclosure, there is provided a method of making a sensor package. In this method the package includes a sensor and at least one external wall. The method includes: inserting an interposer into the sensor package between the sensor and the at least one external wall; wire bonding the sensor to the interposer; and wire bonding the interposer to the at least one external wall.

In any prior method, the interposer may comprise conductive tracking and the method may further comprise: wire bonding the sensor to the conductive tracking; and wire bonding the conductive tracking to the at least one external wall.

In any prior method, the method can include arranging at least two of the interposer, the sensor, and the at least one external wall in the same plane.

In any prior method, the method can include adhesively bonding the interposer to the at least one external wall.

BRIEF DESCRIPTION OF THE DRAWINGS

FIG. 3a shows a perspective view of an interposer in accordance with examples of the present disclosure.

3b shows a perspective views of a sensor package in accordance with examples of the present disclosure.

DETAILED DESCRIPTION

The present disclosure relates to a sensor package and a method of making a sensor package. It will be appreciated that using an interposer, wire bonded to both the sensor and the at least one external wall, is an improved approach to electrically connecting a sensor and a sensor package as compared to the prior art. The interposer allows for short wire bonds from the sensor and the at least one external wall to the interposer, replacing the single, long wire bond from the sensor to the at least one external wall in the prior art. This provides improved resilience of the sensor package under high stress. Furthermore, it allows an existing sensor and package combination to be improved without needing to redesign either component.

Some non-limiting examples of a sensor package and a method of making a sensor package are described in further detail below.

Figure 1:
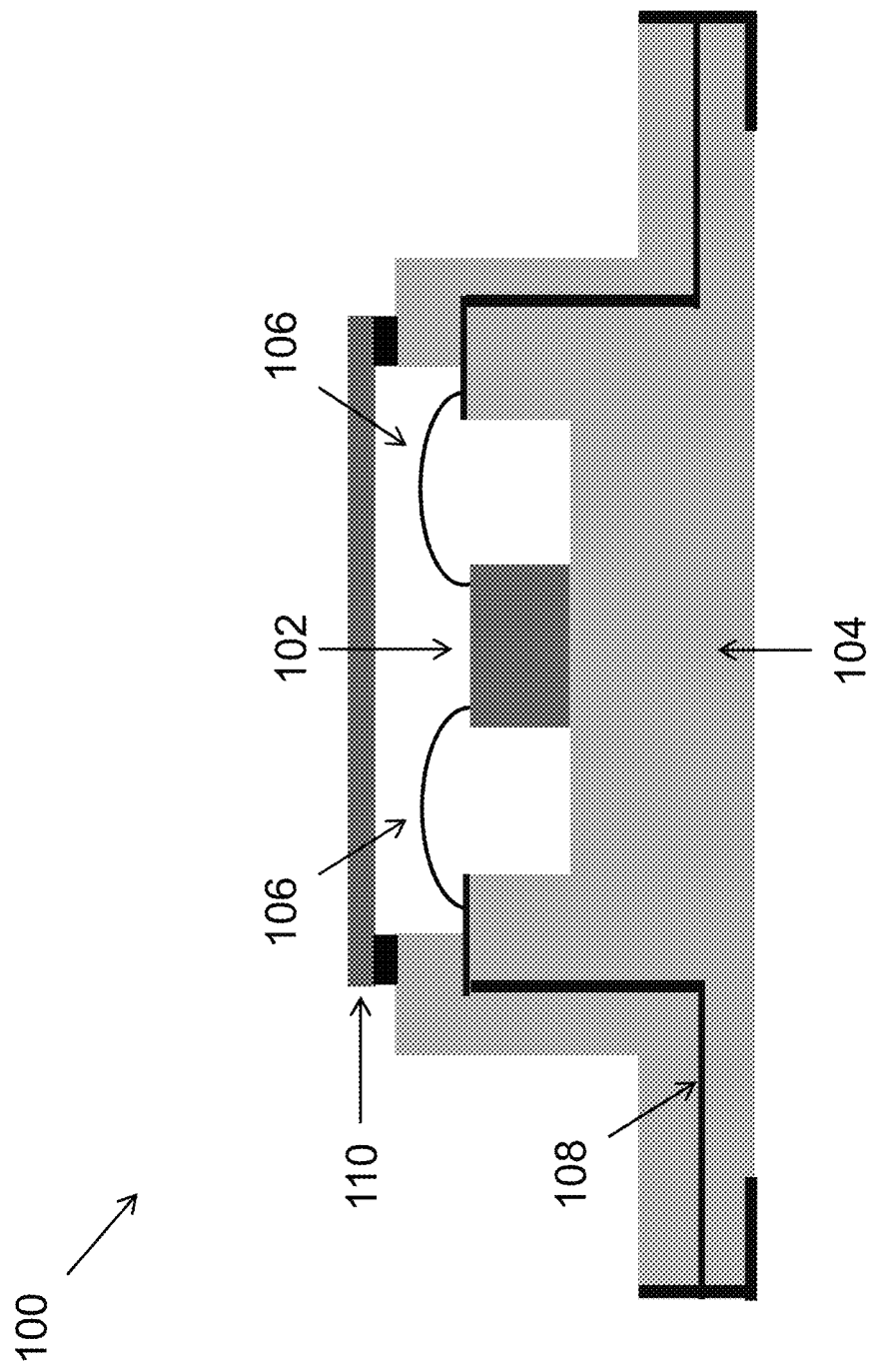
FIG. 1 shows a cross sectional schematic of a prior art sensor package.

FIG. 1 shows a cross sectional schematic of a prior art sensor package assembly 100. The sensor package comprises a sensor 102, package 104, wire bonds 106, conductive tracking 108, and a lid 110.

In order to protect a sensor 102 from external influences that may damage or destroy it when in use, the sensor 102 is placed in a protective package 104 that surrounds the sensor 102. The sensor 102, after being placed in the package 104, is wire bonded to the package 104, in order for electrical connections to be made from the sensor 102 to the external world. The protective package 104 comprises conductive tracking 108 which allows an electrical connection to be made from outside the package 104 to the sensor 102. In order to fully seal the package 104 from external influences, a lid 110 is bonded to the package 104. This sealing of the internal space in the package 104 prevents any external influence directly affecting the sensor 102.

However, extremely stressful events, for example very high accelerations, may cause failures or malfunctions within the sensor package assembly 100. Typically, the first failure within the sensor package assembly 100 due to such high stress events is a failure of one or more wire bonds 106. The failure of a wire bond 106 may occur as a short circuit of one wire bond 106 to another, or the entire wire bond 106 may collapse. A collapse may occur as a joint failure, i.e. where the wire bond 106 is joined to the sensor 102 or the metal tracking 108.

Figure 2:
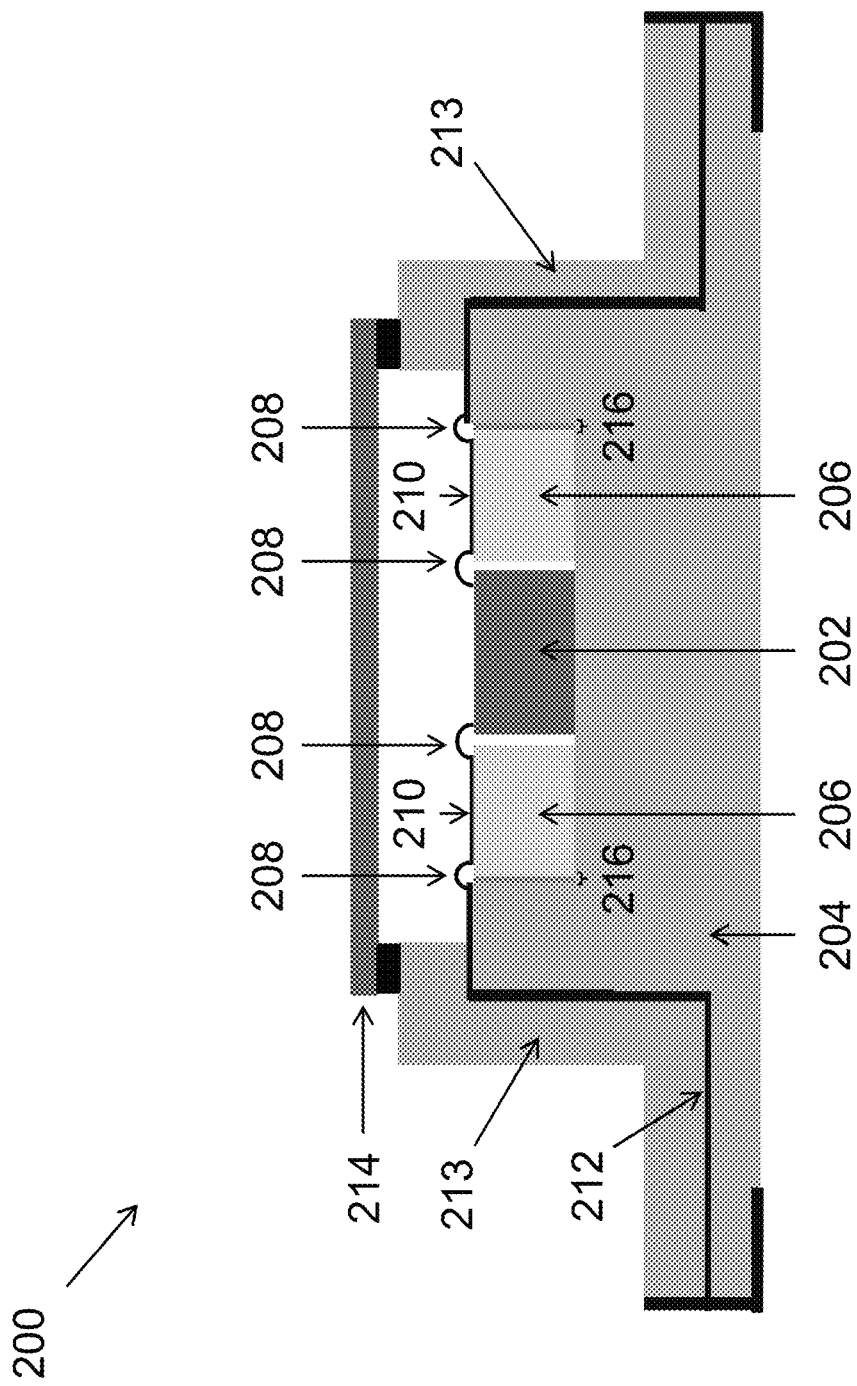
FIG. 2 shows a cross sectional schematic of a sensor package in accordance with an example of the present disclosure.

FIG. 2 shows a cross sectional schematic of a sensor package 200 in accordance with an example of the present disclosure. The sensor package 200 comprises a sensor 202, a base 204, an interposer 206, wire bonds 208, conductive tracking 210, 212, a lid 214, sealed to the external walls 213 and optional adhesive 216 between the interposer 206 and the external walls 213.

In this example, an interposer 206 is inserted between the sensor 202 and the external walls 213, resting on the package base 204. Conductive tracking 210 is deposited on the interposer 206 before it is added to the sensor package 200 to allow an electrical connection to be made from one side of the interposer 206 to the other. The sensor 202 can then be wire bonded 208 to the conductive tracking 210 of the interposer 206, and the conductive tracking 210 of the interposer 206 can be wire bonded 208 to the conductive tracking 212 on the external walls 213. This creates an electrical connection from the sensor 202 to the outside of the package 200, via the interposer 206.

The present inventors have discovered that the failure rate of a wire bond 208 is correlated to the weight of the wire bond 208, and therefore its length. Whilst it is envisaged that other changes such as reducing wire bond 208 diameter or changing the wire bond 208 material may also affect the wire bond 208 weight, the present disclosure is focused on wire bond 208 length, as this approach also provides other effects explained in more detail below.

The insertion and fit of the interposer 206 in this example allows for extremely short wire bonds 208 within the package 204, whilst maintaining the electrical connection between the sensor 202 and the conductive tracking 212 on the package 204. These short wire bonds 208 are significantly more resilient to high stresses than the long wire bonds 106 of FIG. 1. This allows the sensor package 200 to be more resilient to shocks and/or damage, and maintain an increased operating range.

Furthermore, the addition of an interposer 206 allows use of a pre-existing package 204 design, together with the pre-existing package 204 manufacturing method. Thus, the interposer 206 can be retrofitted into such packages 204, removing the need to redesign the entire package 204 to achieve the same reduced wire bond 208 length.

In this example the interposer 206 is adhesively bonded to the package 204 by an adhesive layer 216. This may increase the resilience of the sensor package 200 by ensuring that the interposer 206 stays in place under high stress.

FIGS. 3a and 3b show perspective views of an interposer 300, and a sensor package 310, respectively, in accordance with examples of the present disclosure.

FIG. 3a shows an interposer 300 in accordance with an example of the present disclosure. The interposer 300 is patterned with conductive tracking 302, which allow for connections, for example wire bonds, to be made to it. As shown, the interposer 300 comprises cut-outs 304 which allow adhesive to be dispensed without the adhesive coming into contact with the conductive tracking 302. This prevents any potential contamination of the conductive tracking 302, which could further prevent any potential wire bonding process from taking place. The adhesive also bonds the interposer 300 to one or more externals walls of a package, increasing the resilience of a sensor package, as mentioned above.

FIG. 3b shows a sensor package 310 in accordance with an example of the present disclosure. The sensor package 310 comprises the interposer 300 of FIG. 3a fitted inside its external walls 313 and a sensor 316 fitted inside or surrounded by the interposer 300.

The package 310 is of a pre-existing, mass produced design, and so the interposer 300 is designed to fit specifically within the package 310. As mentioned above, this avoids a redesign of the package 310.

As shown, the interposer 300 is inserted into the package 310, surrounding the sensor 316, occupying the majority of the space between the sensor 316 and the package 310. It can be seen how the interposer 300 is shaped to fit the geometry defined by the external walls 313 of the package 310 and sits in contact with the external walls 313 at least in the corners of the square geometry in this example.

Adhesive may be dispensed into the cut-outs 304 as described above to secure the interposer 300 in place within the package 310. The cut-outs 304 prevent the interposer 300 from moving up past the cured adhesive, which increases the resilience of the sensor package 310.

As shown, the sensor 316 is wire bonded 318 to the conductive tracking 302 on the interposer 300. The conductive tracking 302 on the interposer 300 is further wire bonded 320 to the conductive tracking 314 carried by the external walls 313 of the package 310. As described above, this enables an electrical connection to be made between the sensor 316 and the package 310. As previously mentioned, the decreased length of the wire bonds 318, 320 increases the resilience of the sensor package 310 under high stress.

Thus it will be seen that, in accordance with the present disclosure, a sensor package is provided that may facilitate wire bonds of a decreased length. The present inventors have realised that a decreased wire bond length corresponds to a reduced chance of breakage under high stresses. As the interposer is disposed in the space between the external wall and the sensor, the wire bonds typically joining the sensor directly to the external wall can be shortened into two wire bonds between the sensor and the interposer, and the interposer and the external wall. These shortened wire bonds may be less susceptible to high g-force impacts or shocks, increasing the resilience and operating range of the sensor package. The present inventors have realised that there is a correlation between the weight of a wire bond, and its susceptibility to breaking under high stress. Thus, by reducing the length of a wire bond, its weight is also decreased, and therefore its chance of breakage under high stress. Whilst it is envisaged that other changes such as reducing wire bond diameter or changing the wire bond material may also affect the wire bond weight, the present disclosure is focused on wire bond length.

Use of the present disclosure may further enable the use of a pre-existing package design, together with a pre-existing package manufacturing method. Thus, the interposer can be retrofitted into such pre-existing packages, without any need to redesign an entire package. This saves both the costs and time of such a redesign.

Use of the present disclosure may also allow for existing sensors to be used in emerging markets that require extreme robustness, where such devices may not previously have been suitable.

According to one or more examples of the present disclosure, the interposer comprises conductive tracking, the sensor is wired bonded to the conductive tracking, and the conductive tracking is wire bonded to the at least one external wall. This may allow the sensor to be electrically connected to the at least one external wall, via the conductive tracking of the interposer. This may allow signals from the sensor to be accessed from outside the package. This may also allow for further reduction in the length of the wire bonds, as the conductive tracking may span the width of the interposer. The wire bonds may then be joined to the interposer at the edges. Furthermore, the tracking may be designed to optimise the distance between where a connection is made from the sensor and where a connection is made from the interposer. The tracking may also be designed to optimise the distance between where a connection is made from the package and where a connection is made from the interposer. Thus, in one or more examples, the sensor is wire bonded to the conductive tracking, and the conductive tracking is wire bonded to the at least one external wall.

According to one or more examples of the present disclosure, in addition or alternatively, the at least one external wall is made from a first material, the interposer is made from a second material, and the first and second materials are different. In some examples, the first or second material is ceramic, for example alumina. In some examples, the second material is plastic. In some examples, the second material is FR-4.

According to one or more examples of the present disclosure, in addition or alternatively, the interposer is formed by injection moulding. This may allow for existing manufacturing techniques to be utilised, for example Moulded Interconnect Device technology, streamlining manufacture and reducing costs. In some examples, the interposer is a Moulded Interconnect Device (MID).

According to one or more examples of the present disclosure, in addition or alternatively, the interposer is in contact with the at least one external wall. This means that the interposer may be in physical contact with the at least one external wall as well as being wire bonded to the at least one external wall for electrical contact. This physical contact of the interposer and the at least one external wall may increase the robustness of the package, by reducing the chance of the interposer moving or becoming misaligned within the sensor package during use. For example, the interposer may be fitted inside the package in contact with the at least one external wall. Preferably, the interposer is shaped to fit the geometry defined by the at least one external wall. In some examples, the sensor package comprises at least four external walls forming a square, rectangular or polygonal geometry. In such examples, the interposer may be shaped to have a corresponding square, rectangular or polygonal geometry such that the interposer fits inside the package at least partially in contact with the at least four external walls. In such examples, the interposer is preferably in contact with the external walls at least in the corners of the square, rectangular or polygonal geometry.

According to one or more examples of the present disclosure, in addition or alternatively, the interposer is adhesively bonded to the at least one external wall. This adhesion may further improve the stability and resilience of the sensor package under stress.

According to one or more examples of the present disclosure, in addition or alternatively, the interposer is shaped to accommodate the adhesive used to adhesively bonded the interposer to the at least one external wall. In some examples, the interposer may comprise cut-outs which are shaped to accommodate the adhesive. In some examples, the adhesive accommodated by the cut-outs may increase the resilience of the sensor package under stress. In those examples wherein the interposer is fitted inside the package in contact with the at least one external wall, for example fitted in contact with the corners defined by the external walls, the cut-outs may be arranged between areas of contact, for example between the corners. In such examples the sensor package can benefit from a robust fit with the interposer and the bonding provided by the adhesive.

According to one or more examples of the present disclosure, in addition or alternatively, at least two of the interposer, the sensor, and the at least one external wall are in the same plane. This may allow for a further reduced wire bond length between the sensor and the interposer. This may also allow for a further reduced wire bond length between the interposer and the at least one external wall. In some examples, the interposer, the external wall and the sensor will all be in the same plane.

According to one or more examples of the present disclosure, in addition or alternatively, the interposer surrounds the sensor. This may allow for decreased length wire bonds to be made between the interposer and the sensor. In some examples, the at least one external wall surrounds the interposer. This may allow for decreased length wire bonds to be made between the at least one external wall and the interposer.

According to one or more examples of the present disclosure, in addition or alternatively, the interposer fills at least 50% of the space between the sensor and the at least one external wall. This may allow a decreased length wire bond to connect the interposer and the sensor, and/or the interposer and the at least one external wall. In some examples the interposer fills at least 75% of the space between the sensor and the at least one external wall.

According to one or more examples of the present disclosure, in addition or alternatively, the sensor is a MEMS sensor. In some examples, the MEMS sensor is silicon-based. In some examples, the MEMS sensor is an inertial sensor. In some examples, the MEMS sensor is an accelerometer, a gyroscope, or a pressure sensor.

According to one or more examples of the present disclosure, the sensor package further comprises potting or a lid to seal the package. In this way, the interposer does not seal the package. The sealing of the sensor package by potting or a lid may protect the sensor from any direct external influences that may damage or destroy the sensor. Sealing of the sensor package further allows control of the internal environment of the package, which may be optimised depending on the sensor.

There is also disclosed a method of making a sensor package. In one or more examples, the interposer comprises conductive tracking and the method further comprises: wire bonding the sensor to the conductive tracking; and wire bonding the conductive tracking to the at least one external wall.

In addition, or alternatively, in one or more examples the method further comprises: arranging at least two of the interposer, the sensor, and the at least one external wall in the same plane.

In addition, or alternatively, in one or more examples the method further comprises: adhesively bonding the interposer to the at least one external wall.

It will be appreciated by those skilled in the art that the present disclosure has been illustrated by describing one or more specific examples thereof, but is not limited to these examples; many variations and modifications are possible, within the scope of the accompanying claims. Features of any aspect or example described herein may, wherever appropriate, be applied to any other aspect or example described herein. Where reference is made to different examples or sets of examples, it should be understood that these are not necessarily distinct but may overlap.

The invention claimed is:

1. A sensor package comprising:
   a sensor;
   a package base;
   at least one external wall; and
   an interposer an interposer, wherein the interposer, the sensor, and the at least one external wall are in the same plane;
   wherein the sensor is resting directly on the package base;
   wherein the interposer is also resting directly on the package base and arranged between the sensor and the at least one external wall in said same plane;
   wherein the sensor is wire bonded to the interposer by a first wire bond extending from a first electrical connection point on the sensor to a second electrical connection point on the interposer; and
   wherein the interposer is wire bonded to the at least one external wall by a second wire bond extending from the second electrical connection point on the interposer, or from a third electrical connection point on the interposer, to a final electrical connection point on the at least one external wall.

2. The sensor package of claim 1, wherein the interposer comprises conductive tracking extending between the second and third electrical connection points.

3. The sensor package of claim 1, wherein the at least one external wall is made from a first material, the interposer is made from a second material, and the first and second materials are different.

4. The sensor package of claim 3, wherein the second material is plastic.

5. The sensor package of claim 4, wherein the interposer is a Moulded Interconnect Device (MID).

6. The sensor package of claim 1, wherein the interposer is fitted inside the package in contact with the at least one external wall.

7. The sensor package of claim 1, wherein the interposer is adhesively bonded to the at least one external wall.

8. The sensor package of claim 7, wherein the interposer is shaped to accommodate the adhesive.

9. The sensor package of claim 1, wherein the interposer fills at least 50% of the space between the sensor and the at least one external wall.

10. The sensor package of claim 1, wherein the sensor package further comprises potting or a lid to seal the package.

11. The sensor package of claim 4, wherein the interposer is formed by injection moulding.

12. The sensor package of claim 11, wherein the interposer is a Moulded Interconnect Device (MID).

* * * * *